United States Patent
Seagle

(10) Patent No.: US 7,248,449 B1
(45) Date of Patent: Jul. 24, 2007

(54) MAGNETORESISTIVE READ SENSOR WITH REDUCED EFFECTIVE SHIELD-TO-SHIELD SPACING

(75) Inventor: David J Seagle, Morgan Hill, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 449 days.

(21) Appl. No.: 10/816,294

(22) Filed: Mar. 31, 2004

(51) Int. Cl.
 *G11B 5/33* (2006.01)
(52) U.S. Cl. .................................... 360/324.2
(58) Field of Classification Search ......... 360/324.2, 360/324, 327.1, 327.2, 327.23; 428/694, 428/811.2
See application file for complete search history.

(56) References Cited

U.S. PATENT DOCUMENTS

| | | | |
|---|---|---|---|
| 6,223,420 B1 | 5/2001 | Lee et al. | |
| 6,512,661 B1 | 1/2003 | Louis | |
| 6,783,874 B2 * | 8/2004 | Hasegawa et al. | 428/811.2 |
| 2003/0030948 A1 * | 2/2003 | Umetsu | 360/324.12 |
| 2004/0004792 A1 * | 1/2004 | Hasegawa et al. | 360/324.12 |
| 2004/0106012 A1 * | 6/2004 | Hasegawa et al. | 428/694 EC |
| 2004/0252419 A1 * | 12/2004 | Takano | 360/324.12 |

* cited by examiner

Primary Examiner—Tianjie Chen
(74) Attorney, Agent, or Firm—Knobbe, Martens, Olson & Bear

(57) ABSTRACT

A magnetoresistive read sensor includes a first shield layer and a first gap layer over the first shield layer. The read sensor further includes a spin-valve stack over the first gap layer. The spin-valve stack includes a seed layer over the first gap layer. At least a portion of the seed layer includes a soft-magnetic material. The spin-valve stack further includes an antiferromagnetic layer over the seed layer. The antiferromagnetic layer is magnetically decoupled from the seed layer. The spin-valve stack further includes a free layer over a first portion of the antiferromagnetic layer. The read sensor further includes a bias structure adjacent to the free layer. The bias structure is located over a second portion of the antiferromagnetic layer and is isolated from the seed layer by the second portion.

39 Claims, 9 Drawing Sheets

MAGNETORESISTIVE READ SENSOR WITH REDUCED EFFECTIVE SHIELD-TO-SHIELD SPACING

BACKGROUND OF THE INVENTION

1. Field of the Invention

The present invention relates generally to magnetoresistive read sensors for hard-disk drives and, more particularly, to bottom-synthetic-spin-valve giant-magnetoresistive read sensors.

2. Description of the Related Art

In conventional bottom-synthetic-spin-valve (BSSV) giant-magnetoresistive (GMR) read sensors, the effective bit spacing and magnetic readback pulse width (and resolution) are correlated with the shield-to-shield spacing of the GMR read sensor. During readback, the shields filter out flux from the transition regions between the bits so as to reduce the low spatial frequency while high spatial frequencies are enhanced. Thus, the shields help achieve high signal-to-noise ratios at detection.

Each generation of GMR read sensors has utilized proportionate reductions in the shield-to-shield spacing to achieve the desired discrimination of bits having a smaller bit spacing. However, further shrinkage of the shield-to-shield spacing is limited by a minimum size required for the GMR read sensor and a minimum size for insulative gaps to prevent electrical conduction between the GMR read sensor and the shields. Minimum shield-to-shield spacings of approximately 675 Angstroms have been achieved using conventional technology.

SUMMARY OF THE INVENTION

In certain embodiments, a magnetoresistive read sensor is provided. The read sensor comprises a first shield layer and a first gap layer over the first shield layer. The read sensor further comprises a spin-valve stack over the first gap layer. The spin-valve stack comprises a seed layer over the first gap layer. At least a portion of the seed layer comprises a soft-magnetic material. The spin-valve stack further comprises an antiferromagnetic layer over the seed layer. The antiferromagnetic layer is magnetically decoupled from the seed layer. The spin-valve stack further comprises a free layer over a first portion of the antiferromagnetic layer. The read sensor further comprises a bias structure adjacent to the free layer. The bias structure is located over a second portion of the antiferromagnetic layer and is isolated from the seed layer by the second portion.

In certain embodiments, a method of forming a magnetoresistive read sensor is provided. The method comprises providing a substrate, forming a first shield layer over the substrate, and forming a first gap layer over the first shield layer. The method further comprises forming a spin-valve stack over the first gap layer by forming a seed layer over the first gap layer, forming an antiferromagnetic layer over the seed layer, forming a pinned layer over the antiferromagnetic layer; and forming a free layer over the pinned layer and over a first portion of the antiferromagnetic layer. At least a portion of the seed layer comprises a soft-magnetic material. The antiferromagnetic layer is magnetically decoupled from the seed layer. The method further comprises forming a bias structure over a second portion of the antiferromagnetic layer. The bias structure is adjacent to the free layer and is isolated from the seed layer by the second portion.

In certain embodiments, a magnetoresistive read head is provided. The read head comprises a first shield layer having a magnetostatic potential, and a first gap layer over the first shield layer. The read head further comprises a spin-valve stack over the first gap layer. The spin-valve stack comprises a seed layer over the first gap layer, an antiferromagnetic layer over the seed layer, a pinned layer over the antiferromagnetic layer, and a free layer over the pinned layer and over a first portion of the antiferromagnetic layer. The read head further comprises a bias structure over a second portion of the antiferromagnetic layer and adjacent to the free layer. The seed layer has a magnetostatic potential substantially equal to the magnetostatic potential of the first shield layer.

DETAILED DESCRIPTION OF THE PREFERRED EMBODIMENT

As used herein, the term "layer" is used in its broadest sense, including usage to describe a thickness of a material lying over at least a portion of a surface. A layer can have a single thickness throughout or can have portions with different thicknesses. The material of a layer can be homogenous or can comprise multiple substances. The term "layer" can also refer to a plurality of layers adjoined to one another.

As used herein, the term "over" is used in its broadest sense, including usage to describe a material being in or at a position above or higher than a second material. A configuration with a first layer being over a second layer has at least a portion of the first layer above at least a portion of the second layer. The two layers can be adjoined to one another, or there can be one or more intervening materials or empty space between the two layers. It should be understood that the term "above" is being used in a relative sense rather than an absolute sense. In particular, the term assumes a conventional horizontal orientation for the sensor for reference purposes only.

Figure 1:
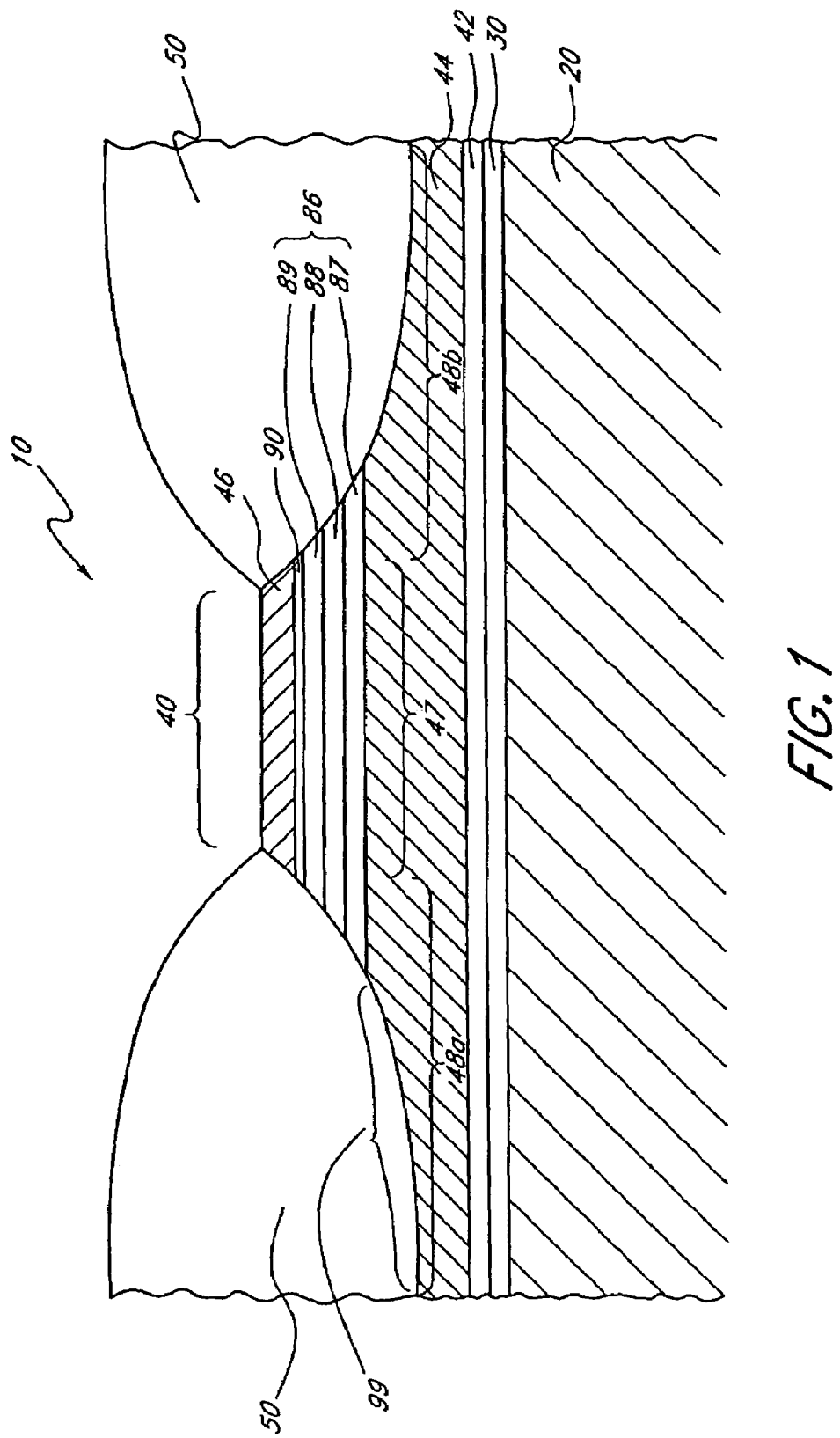
FIG. 1 schematically illustrates an end view of a magnetoresistive read sensor in accordance with embodiments described herein.
Figure 2:
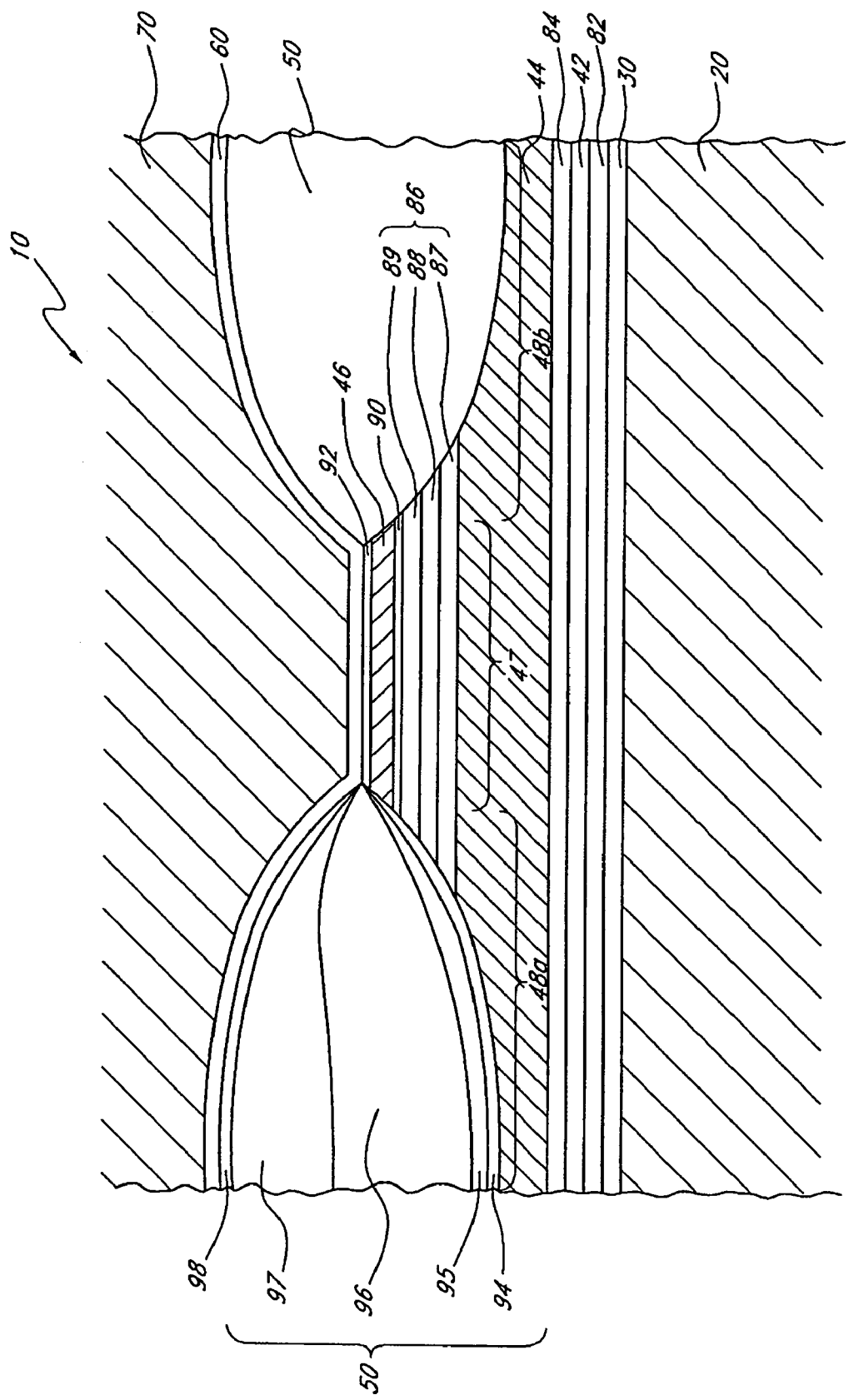
FIG. 2 schematically illustrates an end view of another magnetoresistive read sensor in accordance with embodiments described herein.

FIG. 1 schematically illustrates a magnetoresistive read sensor 10 in accordance with embodiments described herein. The sensor 10 comprises a first shield layer 20 and a first gap layer 30 over the first shield layer 20. The sensor 10 further comprises a spin-valve stack 40 over the first gap layer 30. The spin-valve stack 40 comprises a seed layer 42 over the first gap layer 30. At least a portion of the seed layer 42 comprises a soft-magnetic material. The spin-valve stack 40 further comprises an antiferromagnetic layer 44 over the seed layer 42. The antiferromagnetic layer 44 is magnetically decoupled from the seed layer 42. The spin-valve stack 40 further comprises a free layer 46 over a first portion 47 of the antiferromagnetic layer 44. The sensor 10 further comprises a bias structure 50 adjacent to the free layer 46. The bias structure 50 is over a second portion 48 (shown as portions 48*a* and 48*b* in FIGS. 1 and 2) of the antiferromagnetic layer 44 and is isolated from the seed layer 42 by the second portion 48. As schematically illustrated by FIG. 2, certain embodiments of the sensor 10 further comprise a second gap layer 60 over the spin-valve stack 40 and a second shield layer 70 over the second gap layer 60.

In certain embodiments, the first shield layer 20 is formed on a substrate (not shown). The substrate of certain embodiments is a composite material comprising alumina and titanium carbide. In certain such embodiments, the composite material is electrically conductive and the substrate further comprises an alumina overcoat having a thickness of approximately one micron. Other substrates are compatible with embodiments described herein.

The first shield layer 20 of certain embodiments comprises a soft-magnetic material, which can comprise a nickel-iron alloy, an aluminum-nickel-cobalt alloy, a cobalt-titanium-zirconium alloy, or $Ni_{0.8}Fe_{0.2}$ alloy. The first shield layer 20 of certain embodiments has a thickness in a range between approximately 0.5 micron and approximately 3 microns. Other materials and dimensions for the first shield layer 20 are compatible with embodiments described herein.

In certain embodiments, the first gap layer 30 is formed over the first shield layer 20. The first gap layer 30 of certain embodiments comprises an electrically insulative material (e.g., $Al_2O_3$). The first gap layer 30 of certain embodiments has a thickness in a range between approximately 25 Angstroms and approximately 250 Angstroms, while in other embodiments, the first gap layer 30 has a thickness of approximately 125 Angstroms. Other materials and dimensions for the first gap layer 30 are compatible with embodiments described herein. In certain embodiments, the first gap layer 30 is adjoined to the first shield layer 20 by depositing the first gap layer 30 onto the first shield layer 20. In other embodiments, the read sensor 10 comprises an intervening layer (not shown) between the first gap layer 30 and the first shield layer 20.

In certain embodiments, the seed layer 42 of the spin-valve stack 40 is formed over the first gap layer 30, and at least a portion of the seed layer 42 comprises a soft-magnetic material. The seed layer 42 of certain embodiments has a resistivity in a range between approximately $20 \times 10^{-6}$ ohm-centimeters and approximately $200 \times 10^{-6}$ ohm-centimeters. In still other embodiments, the seed layer 42 is non-conductive. In certain embodiments, the seed layer 42 comprises nickel-iron alloy doped with chromium or rhodium. The dopant concentration of the seed layer 42 is selected to be sufficiently small so that the seed layer 42 is ferromagnetic. U.S. Pat. No. 6,223,420 to Lee et al., which is incorporated in its entirety by reference herein, lists other materials (in the context of a flux guide layer) with magnetizations and resistivities compatible with embodiments describe herein.

The seed layer 42 of certain embodiments has a thickness in a range between approximately 10 Angstroms and approximately 100 Angstroms. In other embodiments, the seed layer 42 has a thickness in a range between approximately 25 Angstroms and approximately 75 Angstroms. In still other embodiments, the seed layer 42 has a thickness of approximately 50 Angstroms. Other dimensions for the seed layer 40 are compatible with embodiments described herein. The seed layer 42 of certain embodiments establishes the crystal structure of the antiferromagnetic layer 44 formed over the seed layer 42 and is thick enough relative to the first gap layer 30 to prevent saturation by the magnetic fields from the media upon readback.

In certain embodiments, the seed layer 42 is adjoined to the first gap layer 30 by depositing the seed layer 42 onto the first gap layer 30. In certain other embodiments, as schematically illustrated by FIG. 2, the read sensor 10 comprises an adhesion layer 82 between the first gap layer 30 and the seed layer 42. In such embodiments, the adhesion layer 82 is deposited onto the first gap layer 30 and the seed layer 42 is deposited onto the adhesion layer 82. The adhesion layer 82 of certain embodiments is selected to have good adhesion to the underlying first gap layer 30 and is also selected to have a relatively high resistivity. In certain embodiments, the adhesion layer 82 comprises tantalum. The adhesion layer 82 of certain embodiments has a thickness in a range between approximately 10 Angstroms and approximately 30 Angstroms. In other embodiments, the adhesion layer 82 has a thickness of approximately 15 Angstroms. The thickness of the adhesion layer 82 in certain embodiments is selected to ensure sufficient coverage of the first gap layer 30. Other materials, dimensions, and deposition techniques (e.g., sputter deposition, ion-beam deposition, vacuum deposition) to form the adhesion layer 82 are compatible with embodiments described herein.

In certain embodiments, the antiferromagnetic layer 44 is formed over the seed layer 42. The antiferromagnetic layer 44 of certain embodiments comprises platinum-maganese alloy and has a thickness of approximately 150 Angstroms. Other materials and dimensions for the antiferromagnetic layer 44 are compatible with embodiments described herein.

In certain embodiments, the antiferromagnetic layer 44 is adjoined to the seed layer 42 by depositing the antiferromagnetic layer 44 onto the seed layer 42. In certain such embodiments, the crystal structure of the antiferromagnetic layer 44 in proximity to the seed layer 42 is adapted to magnetically decouple the antiferromagnetic layer 44 from the seed layer 42. In certain other embodiments, the read sensor 10 comprises an exchange break layer 84 between the antiferromagnetic layer 44 and the seed layer 42, as schematically illustrated by FIG. 2, which magnetically decouples the antiferromagnetic layer 44 from the seed layer 42 by "breaking" or reducing the exchange coupling between the two layers. The exchange break layer 84 of certain embodiments comprises a nonmagnetic material (e.g., NiFeCr). The exchange break layer 84 of certain embodiments has a thickness of approximately 10 Angstroms. In certain embodiments in which the seed layer 42 comprises nickel-iron alloy doped with chromium, the exchange break layer 84 is formed by increasing the chromium doping in the top portion of the seed layer 42 so as to reduce the exchange coupling between the antiferromagnetic layer 44 and the seed layer 42.

In certain embodiments, the free layer 46 is deposited over a first portion 47 of the antiferromagnetic layer 44. The free layer 46 of certain embodiments comprises a magnetic material (e.g., nickel-iron alloy). The free layer 46 of certain embodiments has a thickness in a range between approximately 5 Angstroms and approximately 40 Angstroms. In certain embodiments, the free layer 46 has a thickness of approximately 25 Angstroms. Other materials and dimensions for the free layer 46 are compatible with embodiments described herein.

In certain embodiments, the free layer 46 has a first surface area and the seed layer 42 has a second surface area, where the second surface area is substantially larger than the first surface area. As described more fully below, the seed layer 42 of certain embodiments provides magnetic shielding to the free layer 46. Hence, the second surface area is advantageously significantly larger than the first surface area. For example, in certain embodiments, the second surface area of the seed layer 42 is at least ten times larger than the first surface area of the free layer 46. In another exemplary embodiment, the first surface area is in a range between approximately 0.01 square micron and approximately 0.03 square micron, and the second surface area is in a range between approximately 9 square microns and approximately 64 square microns.

In certain embodiments, the read sensor 10 further comprises a pinned layer 86 between the antiferromagnetic layer 44 and the free layer 46. In certain such embodiments, the pinned layer 86 comprises a first nickel-iron layer 87 on the antiferromagnetic layer 44, a ruthenium layer 88 on the first nickel-iron layer 87, and a second nickel-iron layer 89 on the ruthenium layer 88, as schematically illustrated by FIG. 1. In still other embodiments, the read sensor 10 further comprises a spacer layer 90 (e.g., comprising copper) between the pinned layer 86 and the free layer 46, as schematically illustrated by FIG. 1. Certain embodiments also include a cap layer 92 (e.g., comprising tantalum) on the free layer 46, as schematically illustrated by FIG. 2. Other materials, dimensions, and deposition techniques (e.g., sputter deposition, ion-beam deposition, vacuum deposition) to form the pinned layer 86, the copper spacer layer 90, and the tantalum cap layer 92 are compatible with embodiments described herein.

In certain embodiments, the bias structure 50 is formed adjacent to the free layer 46 and over the second portion 48 (shown as 48a and 48b in FIGS. 1 and 2) of the antiferromagnetic layer 44. The second portion 48 of the antiferromagnetic layer 44 isolates the bias structure 50 from the seed layer 42. In certain embodiments, as schematically illustrated in FIG. 2, the bias structure 50 comprises an adhesion layer 94 (e.g., comprising tantalum), a crystal growth layer 95 (e.g., comprising chromium), a bias layer 96, a lead layer 97 (e.g., comprising gold or rhodium), and a cap layer 98 (e.g., comprising tantalum). In certain embodiments, the bias layer 96 comprises a hard-magnetic material (e.g., cobalt-chromium alloy, cobalt-platinum-chromium alloy). As schematically illustrated by FIG. 1, the bias structure 50 has a lower surface 99 bounded by the antiferromagnetic layer 44. Other materials, thicknesses and deposition techniques (e.g., sputter deposition, ion-beam deposition, or other vacuum deposition techniques) to deposit the bias structure 50 over the first portion 47 of the antiferromagnetic layer 44 are compatible with embodiments described herein. The bias structure 50 schematically illustrated by FIGS. 1 and 2 are examples of partial-mill bias structures, which are compatible with embodiments described herein.

As briefly discussed above, in certain embodiments, the read sensor 10 further comprises a second gap layer 60 over the spin-valve stack 40, and a second shield layer 70 over the second gap layer 60, as schematically illustrated in FIG. 2. The second gap layer 60 of certain embodiments comprises an electrically insulative material (e.g., $Al_2O_3$). In certain embodiments, the second gap layer 60 has a thickness in a range between approximately 25 Angstroms and approximately 250 Angstroms, while in other embodiments, the second gap layer 60 has a thickness of approximately 125 Angstroms. Other materials, dimensions, and deposition techniques (e.g., sputter deposition, ion-beam deposition, chemical-vapor deposition, or other vacuum deposition techniques) to form the second gap layer 60 are compatible with embodiments described herein. In certain embodiments, the second gap layer 60 is adjoined to the spin-valve stack 40 and to the bias structure 50 by depositing the second gap layer 60 onto both the spin-valve stack 40 and the bias structure 50. In other embodiments, the read sensor 10 comprises an intervening layer (not shown) on the spin-valve stack 40 and/or on the bias structure 50 and below the second gap layer 60.

The second shield layer 70 of certain embodiments comprises a soft-magnetic material, which can comprise a nickel-iron alloy, an aluminum-nickel-cobalt alloy, a cobalt-titanium-zirconium alloy, or $Ni_{0.8}Fe_{0.2}$ alloy. The second shield layer 70 of certain embodiments has a thickness in a range between approximately 0.5 micron and approximately 3 microns. Other materials, dimensions, and deposition techniques (e.g., plating, sputter deposition, vapor deposition) to form the second shield layer 70 are compatible with embodiments described herein.

Figure 3:
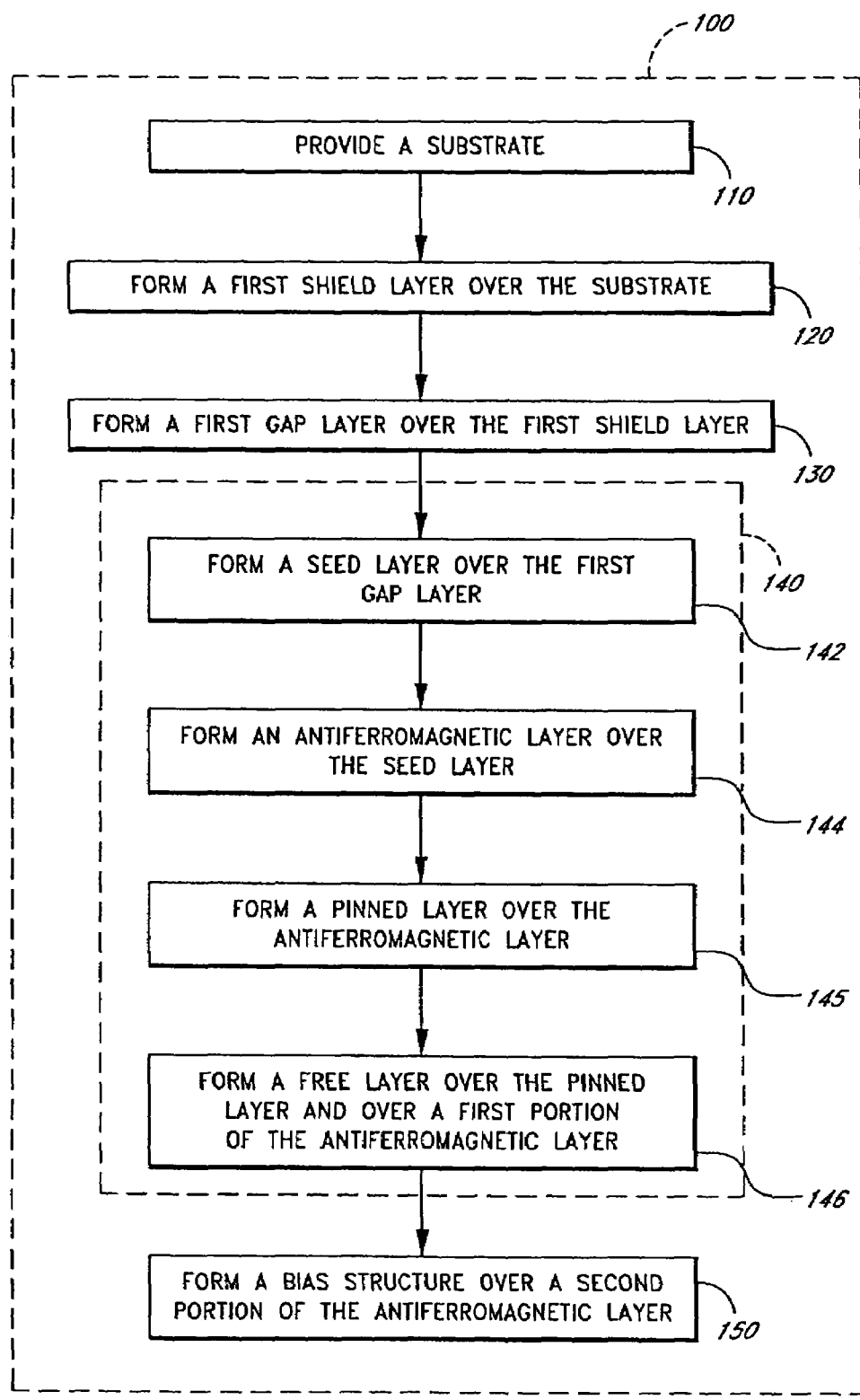
FIG. 3 is a flowchart of a method of forming a magnetoresistive read sensor in accordance with embodiments described herein.

FIG. 3 is a flow diagram of an exemplary embodiment of a method 100 of forming a magnetoresistive read sensor 10. In the following description of the method 100, reference is made to various components of the read head 10 as schematically illustrated by FIG. 1 or FIG. 2. However, the method 100 can be used to form read heads with other structures than those schematically illustrated by FIGS. 1 and 2.

In an operational block 110, a substrate is provided. In an operational block 120, a first shield layer 20 is formed over the substrate. In certain embodiments, forming the first shield layer 20 comprises depositing a soft-magnetic material onto the substrate. Other techniques (e.g., plating, sputter deposition, vapor deposition) to deposit the first shield layer 20 are compatible with embodiments described herein. In certain other embodiments, forming the first shield layer 20 further comprises polishing the deposited first shield layer 20. Such polishing can be used to prepare the first shield layer 20 for subsequent depositions of the other components of the read head 10.

In an operational block 130, a first gap layer 30 is formed over the first shield layer 20. In certain embodiments, forming the first gap layer 30 comprises depositing an electrically insulative material (e.g., $Al_2O_3$) onto the first shield layer 20. Other techniques (e.g., sputter deposition, chemical-vapor deposition, vacuum deposition) to form the first gap layer 30 are compatible with embodiments described herein.

In an operational block 140, a spin-valve stack 40 is formed over the first gap layer 30. In certain embodiments, as schematically illustrated by FIG. 3, forming the spin-valve stack comprises forming a seed layer 42 over the first gap layer 30 in an operational block 142, forming an antiferromagnetic layer 44 over the seed layer 42 in an operational block 144, forming a pinned layer 86 over the antiferromagnetic layer in an operational block 145, and forming a free layer 46 over the pinned layer 86 and over a first portion 47 of the antiferromagnetic layer 44 in an operational block 146. Other deposition techniques (e.g., sputter deposition, chemical-vapor deposition, ion-beam deposition, vacuum deposition) to form the seed layer 42, the antiferromagnetic layer 44, the pinned layer 86, and the free layer 46 are compatible with embodiments described herein.

Figure 4A:
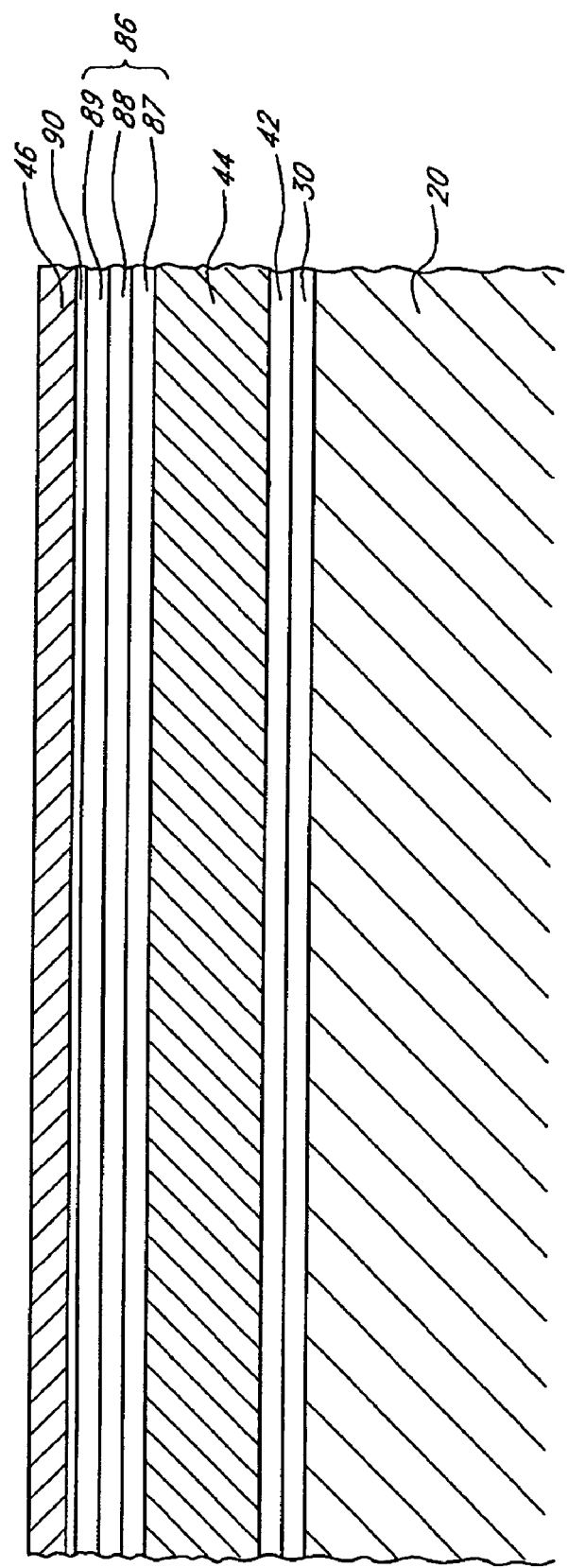
FIGS. 4A and 4B schematically illustrate the spin-valve stack before ion-milling and after ion-milling, respectively.
Figure 4B:
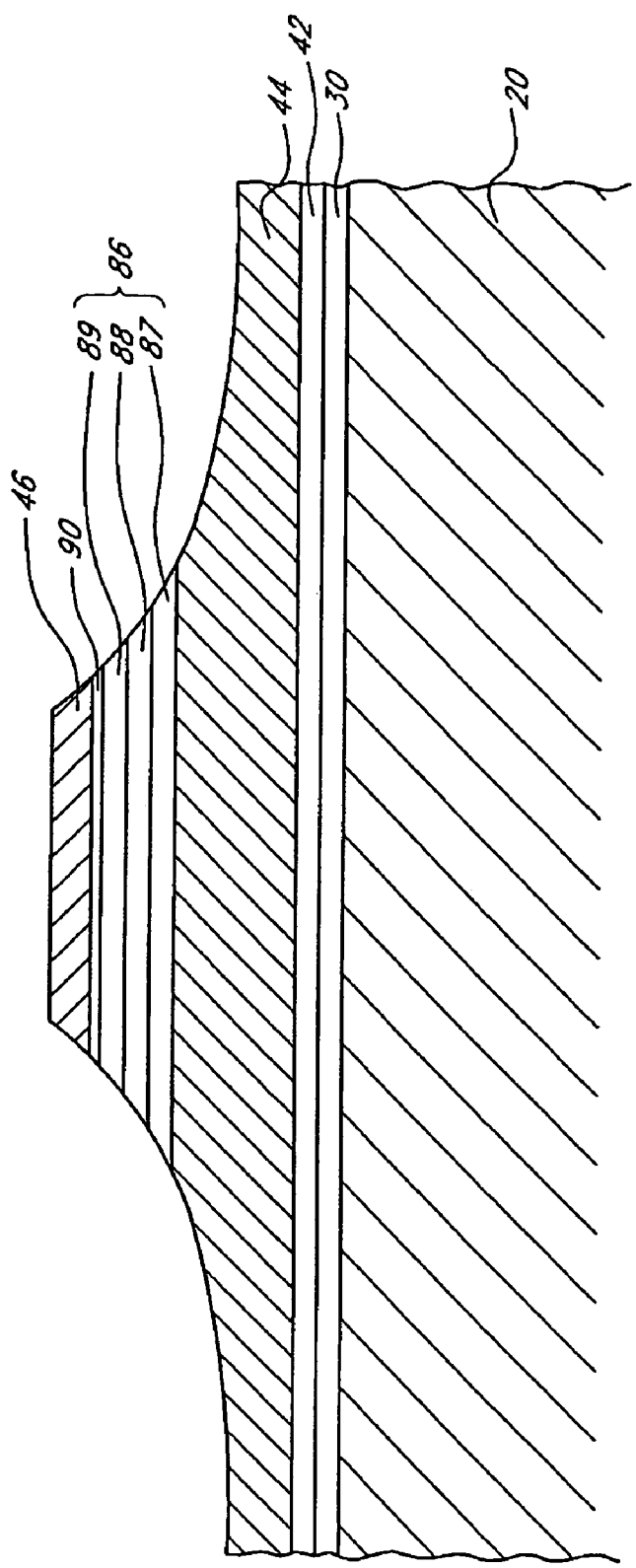

In an operational block 150, a bias structure 50 is formed over a second portion 48 of the antiferromagnetic layer 44. In certain embodiments, forming the bias structure 50 comprises ion-milling away a portion of the spin-valve stack without ion-milling the seed layer 42. FIGS. 4A and 4B schematically illustrate the spin-valve stack 40 before ion-milling and after ion-milling, respectively. In certain embodiments, the ion-milling is terminated on the antiferromagnetic layer 44, as schematically illustrated by FIG. 4B. Once the spin-valve stack 40 has been ion-milled, the bias structure 50 is then deposited. Other deposition techniques (e.g., sputter deposition, ion-beam deposition, vacuum deposition) to deposit the bias structure 50 over the second portion 48 of the antiferromagnetic layer 44 are compatible with embodiments described herein.

Figure 5A:
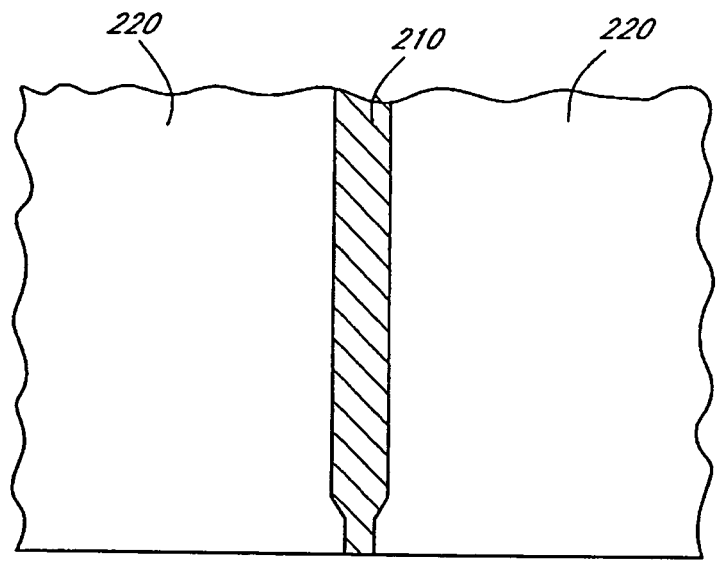
FIGS. 5A-5C schematically illustrate a top view of a read sensor during fabrication of the stripe.
Figure 5B:
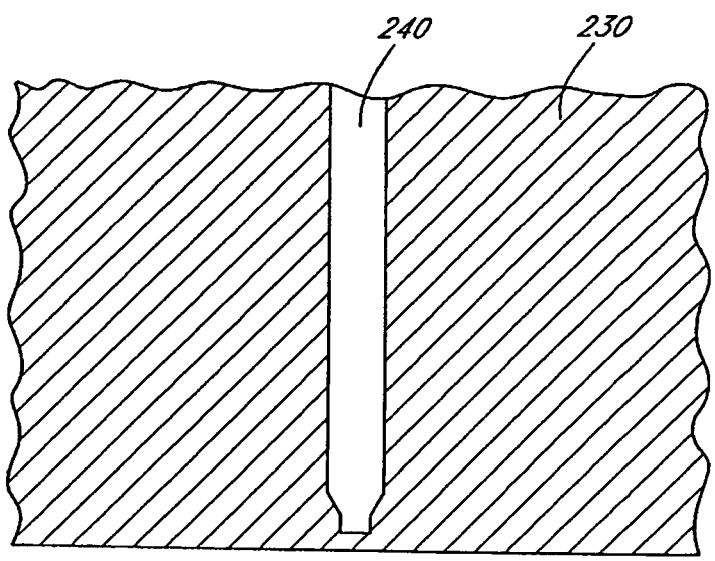
Figure 5C:
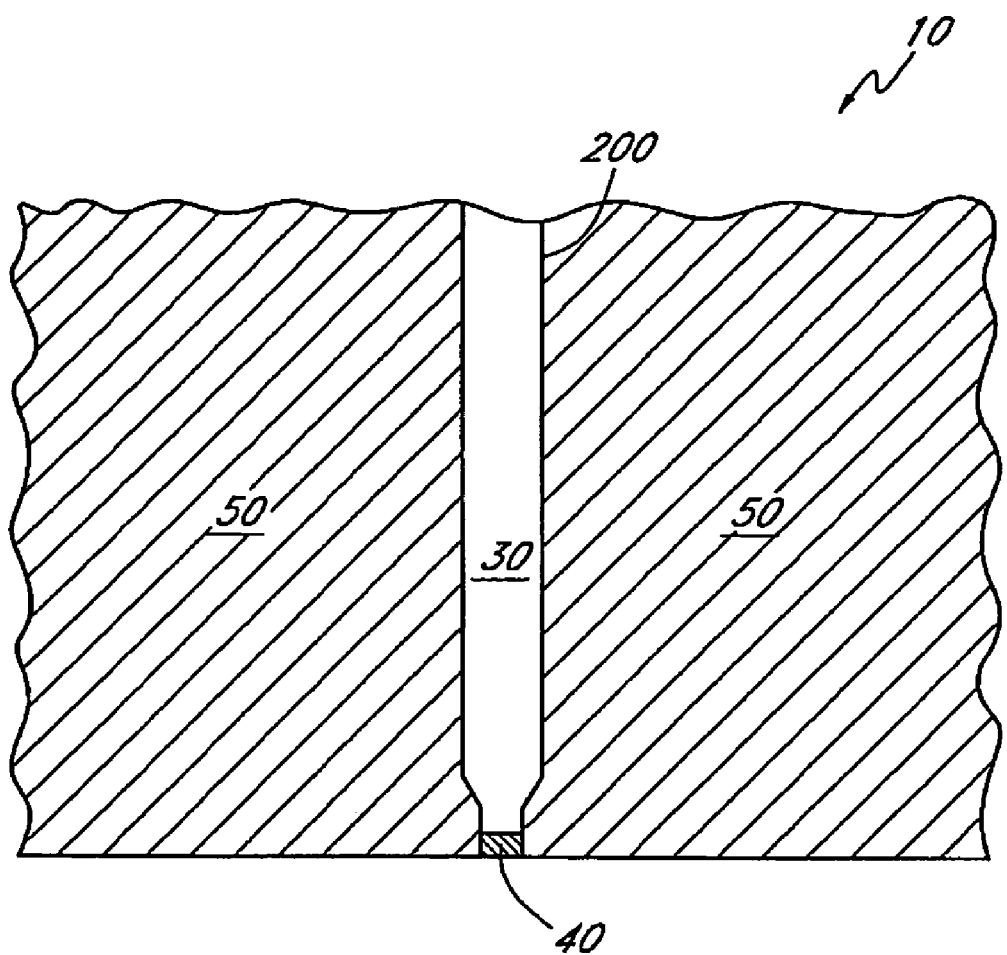

In certain embodiments, forming the read sensor 10 further comprises forming a second gap layer 60 over the spin-valve stack 40 and the bias structure 50. Formation of the read sensor 10 in other embodiments comprises ion-milling the read sensor 10 to define a stripe 200. In certain embodiments, the stripe 200 is formed in a process schematically illustrated by FIGS. 5A-5C, which show a top view of a read sensor 10 during the fabrication of the stripe 200. In FIG. 5A, a photoresist layer is applied to cover a first region 210 while not covering a second region 220. The wafer is then ion-etched to remove the free layer 46 and the pinned layer 86 from the second region 220. The bottom of the antiferromagnetic layer 44 and the ferromagnetic portion of the seed layer 42 remain intact in the second region 220. The bias material 50 is then deposited full film, replacing the removed material of the second region 220 and depositing on top of the photoresist in the first region 210. The resultant bias material 50 and the seed layer 42 remaining in the second region 220 are adjacent to, and electrically connected to, the free layer 46 and the antiferromagnetic layer 44 in the first region 210. In FIG. 5B, a photoresist layer is applied to cover a third region 230 while not covering a fourth region 240. The fourth region 240 is then ion-etched to expose the first gap layer 30 in the fourth region 240. FIG. 5C schematically illustrates the resulting structure after removal of the photoresist layer. By ion-milling the read sensor 10 in this way, the spin-valve stack 40 is the primary conduit for electrical signals used to detect the resistance of the magnetoresistive read sensor 10. Current shunting for this configuration is similar to that of conventional technology, as is the GMR sensitivity. Other processes used to define the stripe 200 are compatible with embodiments described herein.

In certain embodiments, the seed layer 42 has a magnetic reluctance to the first shield layer 20 which is significantly smaller than the magnetic reluctance of the seed layer 42 to the free layer 46. In such embodiments, the seed layer 42 has a magnetostatic potential substantially equal to the magnetostatic potential of the first shield layer 20.

Figure 6:
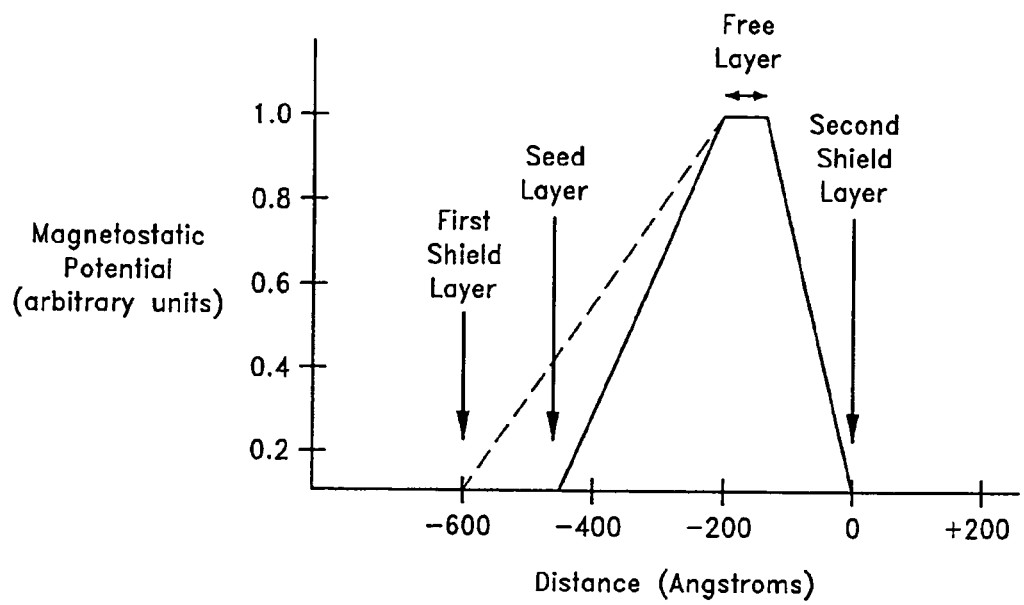
FIG. 6 is a graph which compares the magnetostatic potential between the first shield layer and the second shield layer for (i) a conventional configuration (dashed line) and (ii) an exemplary configuration with a ferromagnetic seed layer (solid line).
Figure 7A:
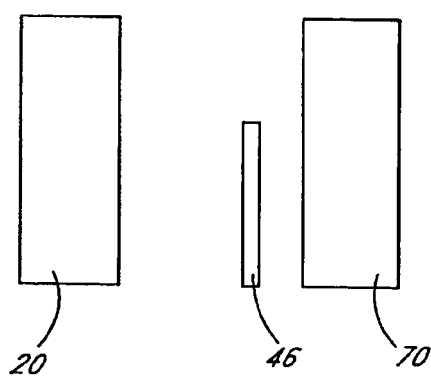
FIGS. 7A and 7B provide schematic views of the magnetic layers of the conventional configuration and of the ferromagnetic seed layer configuration, respectively.
Figure 7B:
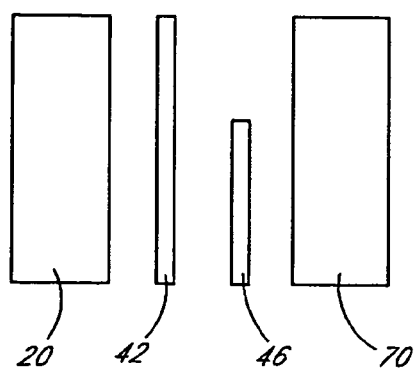

FIG. 6 is a graph which compares the magnetostatic potential between the first shield layer 20 and the second shield layer 70 for (i) a conventional configuration (dashed line) and (ii) an exemplary configuration with a ferromagnetic seed layer 42 (solid line). FIGS. 7A and 7B provide schematic views of the magnetic layers of the two configurations under comparison in FIG. 6. Both configurations have a spacing between the first shield layer 20 and the second shield layer 70 of approximately 605 Angstroms, have a first gap layer 30 with a thickness of approximately 125 Angstroms, and have an adhesion layer 82 with a thickness of approximately 15 Angstroms. The conventional configuration includes a non-magnetic seed layer 42 comprising NiFeCr and having a thickness of approximately 30 Angstroms. The ferromagnetic seed layer configuration has a seed layer 42 comprising a soft-magnetic material and having a thickness of approximately 50 Angstroms and utilizing an exchange break layer 84 having a thickness of approximately 10 Angstroms.

FIG. 6 illustrates that the magnetostatic potential of the conventional configuration (dashed line) increases linearly from zero at the first shield layer 20 to a maximum value at the free layer 46 and decreases linearly from the maximum value at the free layer 46 back down to zero at the second shield layer 70. In contrast, FIG. 6 illustrates that the magnetostatic potential of the ferromagnetic seed layer configuration (solid line) remains equal to approximately zero between the first shield layer 20 to the seed layer 42. The magnetostatic potential increases linearly from zero at the seed layer 42 to a maximum value at the free layer 46, and decreases linearly from the maximum value at the free layer 46 back down to zero at the second shield layer 70. Therefore, the ferromagnetic seed layer configuration has an effective shield-to-shield spacing of approximately 450 Angstroms, which is smaller than the actual physical spacing of 600 Angstroms between the first shield layer 20 and the second shield layer 70.

Figure 8:
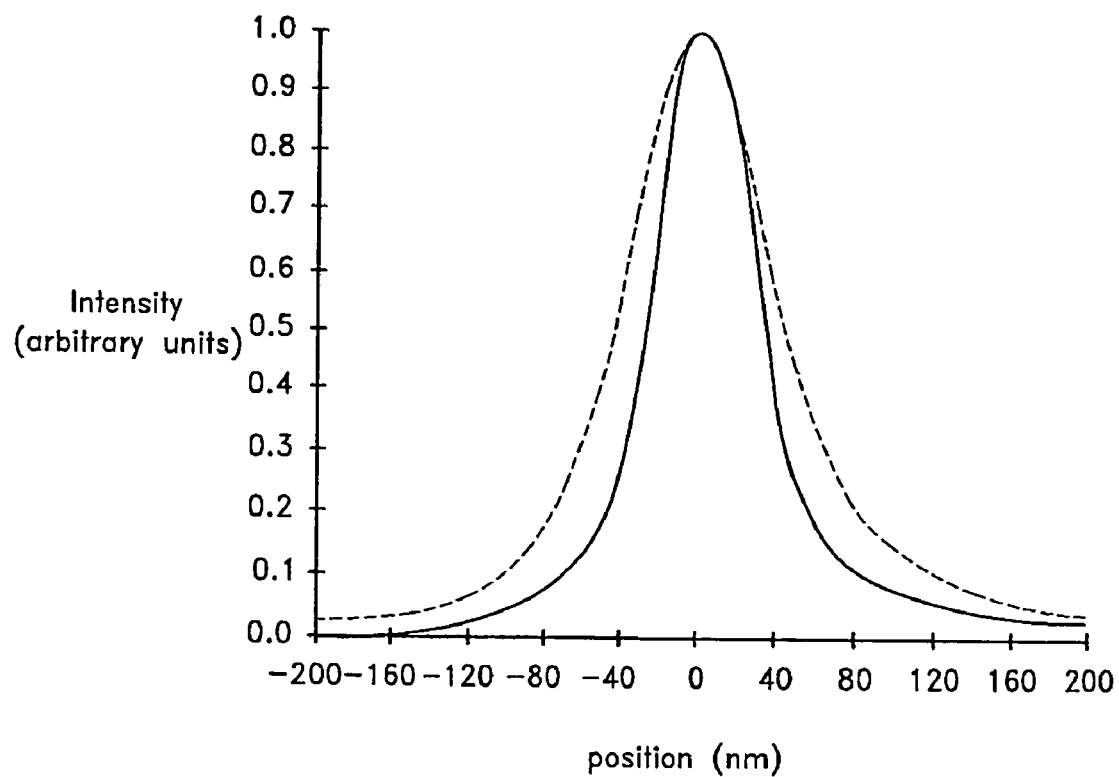
FIG. 8 is a graph which compares the pulse shapes of the conventional configuration (dashed line) and of the ferromagnetic seed layer configuration (solid line).

FIG. 8 is a graph which compares the pulse shapes of the conventional configuration (dashed line) and the ferromagnetic seed layer configuration (solid line). For the conventional configuration, the pulse shape has a half-width ("PW50") of approximately 100 nanometers. However, for the ferromagnetic seed layer configuration, PW50 is equal to approximately 62 nanometers, a reduction of approximately one-third.

What is claimed is:

1. A magnetoresistive read sensor comprising:
   a first shield layer;
   a first gap layer over the first shield layer;
   a spin-valve stack over the first gap layer, the spin-valve stack comprising:
      a seed layer over the first gap layer, at least a portion of the seed layer comprising a soft-magnetic material;
      an antiferromagnetic layer over the seed layer, the antiferromagnetic layer magnetically decoupled from the seed layer; and
      a free layer over a first portion of the antiferromagnetic layer; and
   a bias structure adjacent to the free layer, the bias structure located over a second portion of the antiferromagnetic layer and isolated from the seed layer by the second portion.

2. The read sensor of claim 1, wherein the first shield layer comprises a soft-magnetic material.

3. The read sensor of claim 1, wherein the first shield layer has a thickness in a range between approximately 0.5 micron and approximately 3 microns.

4. The read sensor of claim 1, wherein the first gap layer comprises an electrically insulative material.

5. The read sensor of claim 1, wherein the first gap layer has a thickness in a range between approximately 25 Angstroms and approximately 250 Angstroms.

6. The read sensor of claim 1, wherein the first gap layer has a thickness of approximately 125 Angstroms.

7. The read sensor of claim 1, wherein the seed layer has a resistivity in a range between approximately $20 \times 10^{-6}$ ohm-cm and approximately $200 \times 10^{-6}$ ohm-cm.

8. The read sensor of claim 1, wherein the seed layer is non-conductive.

9. The read sensor of claim 1, wherein the seed layer comprises nickel-iron alloy doped with chromium or rhodium, the seed layer having a dopant concentration.

10. The read sensor of claim 9, wherein the dopant concentration is sufficiently small so that the seed layer is ferromagnetic.

11. The read sensor of claim 1, wherein the seed layer has a thickness in a range between approximately 10 Angstroms and approximately 100 Angstroms.

12. The read sensor of claim 1, wherein the seed layer has a thickness in a range between approximately 25 Angstroms and approximately 75 Angstroms.

13. The read sensor of claim 1, wherein the seed layer has a thickness of approximately 50 Angstroms.

14. The read sensor of claim 1, wherein the antiferromagnetic layer comprises platinum-manganese alloy.

15. The read sensor of claim 1, wherein the antiferromagnetic layer has a thickness of approximately 150 Angstroms.

16. The read sensor of claim 1, wherein the free layer comprises a magnetic material.

17. The read sensor of claim 1, wherein the free layer has a thickness in a range between approximately 5 Angstroms and approximately 40 Angstroms.

18. The read sensor of claim 1, wherein the free layer has a thickness of approximately 25 Angstroms.

19. The read sensor of claim 1, wherein the bias structure comprises a bias layer comprising a hard-magnetic material.

20. The read sensor of claim 1, wherein the bias structure has a lower surface bounded by the antiferromagnetic layer.

21. The read sensor of claim 1, further comprising an adhesion layer between the first gap layer and the seed layer.

22. The read sensor of claim 21, wherein the adhesion layer comprises tantalum.

23. The read sensor of claim 21, wherein the adhesion layer has a thickness in a range between approximately 10 Angstroms and approximately 30 Angstroms.

24. The read sensor of claim 21, wherein the adhesion layer has a thickness of approximately 15 Angstroms.

25. The read sensor of claim 1, further comprising an exchange break layer between the antiferromagnetic layer and the seed layer, the exchange break layer adapted to magnetically decouple the antiferromagnetic layer from the seed layer.

26. The read sensor of claim 25, wherein the exchange break layer comprises a nonmagnetic material.

27. The read sensor of claim 25, wherein the exchange break layer has a thickness of approximately 10 Angstroms.

28. The read sensor of claim 1, further comprising a pinned layer between the antiferromagnetic layer and the free layer.

29. The read sensor of claim 28, wherein the pinned layer comprises a first nickel-iron layer on the antiferromagnetic layer, a ruthenium layer on the first nickel-iron layer, and a second nickel-iron layer on the ruthenium layer.

30. The read sensor of claim 28, further comprising a copper spacer layer between the pinned layer and the free layer.

31. The read sensor of claim 1, further comprising a second gap layer over the spin-valve stack, and a second shield layer over the second gap layer.

32. The read sensor of claim 31, wherein the second gap layer comprises an electrically insulative material.

33. The read sensor of claim 31, wherein the second gap layer has a thickness in a range between approximately 25 Angstroms and approximately 250 Angstroms.

34. The read sensor of claim 31, wherein the second gap layer has a thickness of approximately 125 Angstroms.

35. The read sensor of claim 31, wherein the second shield layer comprises a soft-magnetic material.

36. The read sensor of claim 31, wherein the second shield layer has a thickness in a range between approximately 0.5 micron and approximately 3 microns.

37. The read sensor of claim 1, wherein the free layer has a first surface area and the seed layer has a second surface area, the second surface area substantially larger than the first surface area.

38. The read sensor of claim 37, wherein the second surface area is at least ten times larger than the first surface area.

39. The read sensor of claim 37, wherein the first surface area is in a range between approximately 0.01 square micron and approximately 0.03 square micron, and the second surface area is in a range between approximately 9 square microns and approximately 64 square microns.

* * * * *